US 6,706,557 B2

(12) United States Patent
Koopmans

(10) Patent No.: US 6,706,557 B2
(45) Date of Patent: Mar. 16, 2004

(54) METHOD OF FABRICATING STACKED DIE CONFIGURATIONS UTILIZING REDISTRIBUTION BOND PADS

(75) Inventor: Michel Koopmans, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/422,251

(22) Filed: Apr. 24, 2003

(65) Prior Publication Data

US 2003/0203537 A1 Oct. 30, 2003

Related U.S. Application Data

(62) Division of application No. 09/960,089, filed on Sep. 21, 2001.

(51) Int. Cl.[7] .......................... H01L 21/44; H01R 43/00
(52) U.S. Cl. ...................... 438/109; 438/118; 438/612; 29/825; 29/829; 29/858; 29/856; 29/857; 29/874; 29/884
(58) Field of Search .............................. 438/22, 26, 48, 438/106, 107–109, 118, 119, 584, 597, 612–614, 340, 343, 365, 368; 29/592, 592.1, 825, 829, 854, 855, 856, 857, 858, 874, 876, 877, 884; 156/60; 361/600, 679, 782, 729, 748, 760, 767, 772–774; 257/678, 690, 685–687, 723–725, 730, 734, 737, 738, 777–780, 782, 783, 784, 786, 787; 228/101, 178, 179.1, 180.1, 180.21, 180.22; 174/50, 52.1–52.4, 68.1

(56) References Cited

U.S. PATENT DOCUMENTS

| | | | |
|---|---|---|---|
| 5,012,323 A | 4/1991 | Farnworth | 257/723 |
| 5,128,831 A | 7/1992 | Fox, III et al. | 361/396 |
| 5,291,061 A | 3/1994 | Ball | 257/686 |
| 5,323,060 A | 6/1994 | Fogal et al. | 257/777 |
| 5,399,898 A | 3/1995 | Rostoker | 257/499 |
| 5,608,262 A | 3/1997 | Degani et al. | 257/723 |
| 5,719,440 A | 2/1998 | Moden | 257/697 |
| 5,917,242 A | 6/1999 | Ball | 257/737 |

(List continued on next page.)

FOREIGN PATENT DOCUMENTS

| | | |
|---|---|---|
| JP | 58-218130 | 12/1983 |
| JP | 6-132474 | 5/1994 |
| JP | 11-214448 | 8/1999 |

OTHER PUBLICATIONS

Rad Redistribution, Process Diagram, pp. 1–2, http://www.focusinterconnect.com/serv_pad.htm, Jul. 12, 2001.

Garrou, Philip, "Wafer–Level Packaging Has Arrived", pp. 1–10, *Semiconductor International*, http://www.semiconductor.net/semiconductor/issues/issues/2000/200010/six001003waf/.asp, Jul. 16, 2001.

Primary Examiner—Alonzo Chambliss
(74) Attorney, Agent, or Firm—TraskBritt

(57) ABSTRACT

A stacked semiconductor package including a plurality of stacked semiconductor devices on a substrate, and a method of forming the same. The semiconductor devices are stacked in an active surface-to-backside configuration. The top semiconductor die is flipped over to face the active surface of the semiconductor die directly below. An electrical connector can extend from a bond pad on the top semiconductor die to a redistribution circuit on the semiconductor die below. The redistribution circuit can be electrically connected to a substrate. Alternatively, an electrical connector extends from a bond pad on the top semiconductor die to a bond pad on a substrate.

49 Claims, 8 Drawing Sheets

U.S. PATENT DOCUMENTS

| | | | |
|---|---|---|---|
| 5,923,090 A | 7/1999 | Fallon et al. | 257/777 |
| 5,952,725 A | 9/1999 | Ball | 257/777 |
| 6,051,878 A | 4/2000 | Akram et al. | 257/686 |
| 6,051,886 A | 4/2000 | Fogal et al. | 257/777 |
| 6,084,308 A | 7/2000 | Kelkar et al. | 257/777 |
| 6,093,938 A | 7/2000 | Minemier et al. | 257/80 |
| 6,097,098 A | 8/2000 | Ball | 257/786 |
| 6,165,815 A | 12/2000 | Ball | 438/113 |
| 6,168,973 B1 | 1/2001 | Hubbard | 438/109 |
| 6,169,329 B1 | 1/2001 | Farnworth et al. | 257/780 |
| 6,197,613 B1 | 3/2001 | Kung et al. | 438/106 |
| 6,208,018 B1 | 3/2001 | Ma et al. | 257/669 |
| 6,221,691 B1 | 4/2001 | Schrock | 438/106 |
| 6,222,265 B1 | 4/2001 | Akram et al. | 257/723 |
| 6,229,158 B1 | 5/2001 | Minemier et al. | 257/81 |
| 6,230,400 B1 | 5/2001 | Tzanavaras et al. | 29/840 |
| 6,238,949 B1 | 5/2001 | Nguyen et al. | 438/106 |
| 6,252,305 B1 | 6/2001 | Lin et al. | 257/777 |
| 6,271,601 B1 | 8/2001 | Yamamoto et al. | 257/784 |
| 6,355,977 B1 | 3/2002 | Nakamura | 257/693 |
| 6,413,797 B2 | 7/2002 | Oka et al. | 438/108 |
| 6,469,370 B1 | 10/2002 | Kawahara et al. | 257/678 |
| 6,593,662 B1 * | 7/2003 | Pu et al. | 257/777 |

* cited by examiner

METHOD OF FABRICATING STACKED DIE CONFIGURATIONS UTILIZING REDISTRIBUTION BOND PADS

CROSS-REFERENCE TO RELATED APPLICATION

This application is a divisional of application Ser. No. 09/960,089, filed Sep. 21, 2001, pending.

BACKGROUND OF THE INVENTION

1. Field of the Invention

The present invention relates to the use of bumping technology in a stacked die package. More specifically, the present invention employs bumping technology and redistribution technology to minimize a stacked die package height or to provide additional protection for the packaged die.

2. State of the Art

Chip-On-Board technology is used to attach semiconductor dice to a printed circuit board and includes flip chip attachment, wirebonding, and tape automated bonding ("TAB"). One example of a flip chip is a semiconductor chip that has a pattern or array of electrical terminations or bond pads spaced around an active surface of the flip chip for face-down mounting of the flip chip to a substrate. Generally, such a flip chip has an active surface having one of the following electrical connection patterns: Ball Grid Array ("BGA"), wherein an array of minute solder balls is disposed on the surface of a flip chip that attaches to the substrate ("the attachment surface"); Slightly Larger than Integrated Circuit Carrier ("SLICC"), which is similar to a BGA, but has a smaller solder ball pitch and diameter than a BGA; or a Pin Grid Array ("PGA"), wherein an array of small pins extends substantially perpendicularly from the attachment surface of a flip chip. The pins conform to a specific arrangement on a printed circuit board or other substrate for attachment thereto.

With the BGA or SLICC, the arrangement of solder balls or other conductive elements on the flip chip must be a mirror image of the connecting bond pads on the printed circuit board such that precise connection is made. The flip chip is bonded to the printed circuit board by refluxing the solder balls. The solder balls may also be replaced with a conductive polymer. With the PGA, the pin arrangement of the flip chip must be a mirror image of the pin recesses on the printed circuit board. After insertion, the flip chip is generally bonded by soldering the pins into place. An underfill encapsulant is generally disposed between the flip chip and the printed circuit board for environmental protection and to enhance the attachment of the flip chip to the printed circuit board. A variation of the pin-in-recess PGA is a J-lead PGA, wherein the loops of the J's are soldered to pads on the surface of the circuit board.

Wirebonding and TAB attachment generally begin with attaching a semiconductor chip to the surface of a printed circuit board with an appropriate adhesive, such as an epoxy. In wirebonding, bond wires are attached, one at a time, to each bond pad on the semiconductor chip and extend to a corresponding lead or trace end on the printed circuit board. The bond wires are generally attached through one of three industry-standard wire bonding techniques: ultrasonic bonding, thermocompression bonding and thermosonic bonding. Ultrasonic bonding uses a combination of pressure and ultrasonic vibration bursts to form a metallurgical cold weld. Thermocompression bonding uses a combination of pressure and elevated temperature to form a weld while thermosonic bonding uses a combination of pressure, elevated temperature, and ultrasonic vibration bursts. With TAB, ends of metal leads carried on an insulating tape, such as a polyimide, are respectively attached to the bond pads on the semiconductor chip and to the lead or trace ends on the printed circuit board. An encapsulant is generally used to cover the bond wires and metal tape leads to prevent contamination.

Higher performance, lower cost, increased miniaturization of components, and greater packaging density of integrated circuits are ongoing goals of the semiconductor industry. Greater integrated circuit density is primarily limited by the space available for mounting dice on a substrate such as a printed circuit board. One way to achieve greater integrated circuit density is by attaching two or more semiconductor dice or chips in a single semiconductor assembly. Such devices are generally known as multichip modules ("MCM").

To further increase integrated circuit density, semiconductor dice can be stacked vertically. For example, dice may be stacked vertically on opposite sides of a substrate, or atop each other with intervening insulative layers, prior to encapsulation. U.S. Pat. No. 5,012,323, issued Apr. 30, 1991 to Farnworth, teaches combining a pair of dice mounted on opposing sides of a lead frame. An upper, smaller die is back-bonded to the upper surface of the leads of the lead frame via a first adhesively coated, insulated film layer. A lower, larger die is face-bonded to the lower lead frame die-bonding region via a second, adhesively coated, insulative film layer. The wirebonding pads on both the upper die and lower die are interconnected with the ends of their associated lead extensions with gold or aluminum bond wires. The lower die must be slightly larger than the upper die such that the die pads are accessible from above through a bonding window in the lead frame such that gold wire connections can be made to the lead extensions.

U.S. Pat. No. 5,291,061, issued Mar. 1, 1994 to Ball ("Ball"), teaches a multiple stacked die device containing up to four stacked dice supported on a die-attach paddle of a lead frame, the assembly not exceeding the height of current single die packages, and wherein the bond pads of each die are wirebonded to lead fingers. The low profile of the device is achieved by close-tolerance stacking which is made possible by a low-loop-profile wirebonding operation and thin adhesive layers between the stacked dice. However, Ball requires long bond wires to electrically connect the stacked dice to the lead frame. These long bond wires increase resistance and may result in bond wire sweep during encapsulation.

U.S. Pat. No. 6,222,265 issued Apr. 24, 2001 to Akram et al. teaches a stacked multi-substrate device using flip chips and chip-on-board assembly techniques in which all chips are wire bonded to a substrate. Further, columnar electrical connections attach a base substrate to a stacked substrate.

U.S. Pat. No. 5,952,725 issued Sep. 14, 1999 to Ball teaches a stacked semiconductor device having wafers attached back to back via adhesive. The upper wafer can be attached to a substrate by wire bonding or tape automated bonding. Alternatively, the upper wafer can be attached to a lead frame or substrate, located above the wafer, by flip chip attachment.

Several drawbacks exist with conventional die stacking techniques. As shown in FIG. 1, the top semiconductor die 12 of a semiconductor die stack assembly 10 is typically wire bonded 14 to a substrate 16. With wire bonding, the encapsulant 17 must accommodate the wire loops, increasing the overall package height 18. Further, with wire bonding, a chance of electrical performance problems or shorting exists if the various wires loops come too close to each other. The wire loops can also get swept during packaging, causing further electrical problems. Flip chip attachment overcomes some of these limitations. However, die stacking that relies on flip chip attachment requires the stacked die to be manufactured and vertically aligned to bring complementary circuitry into perpendicular alignment with a lower die.

Similarly, as shown in one configuration of a semiconductor die stack assembly 600 known to the inventor herein (FIG. 6), a top semiconductor die 640 is stacked above a smaller bottom semiconductor die 620 in an active surface 622 of bottom semiconductor die 620 to back side 674 of top semiconductor die 640 arrangement. An optional adhesive layer 626, is shown between bottom semiconductor die 620 and top semiconductor die 640. Peripheral edges 664, 666 of the larger top semiconductor die 640 extend laterally beyond peripheral edges 660, 662 of the bottom semiconductor die 620. Similarly, a stacked board-on-chip assembly 700 is shown in FIG. 7 wherein a top semiconductor die 740 is stacked above a smaller, bottom semiconductor die 720 in a back side 724 of bottom semiconductor die 720 to back side 746 of top semiconductor die 740 arrangement. The peripheral edges 764, 766 of the larger top semiconductor die 740 extend laterally beyond the peripheral edges 760, 762 of the smaller bottom semiconductor die 720. A plurality of external solder balls 772 may be used for electrical connection of the encapsulated stacked board-on-chip assembly 700 to another assembly. FIG. 8 illustrates a configuration of a stacked semiconductor die assembly 800 known to the inventor herein depicting multiple devices on a substrate wherein each device includes two semiconductor dice in a laterally staggered arrangement. The die are stacked such that the active surface 822 of the bottom semiconductor die 820 faces the back side 846 of the top semiconductor die 840. At least one peripheral edge 866, 864 of a top semiconductor die 840 extends laterally beyond a corresponding peripheral edge 862, 860 of a bottom semiconductor die 820. In FIGS. 6, 7 and 8, the top semiconductor dice 640, 740, 840 and the bottom semiconductor dice 620, 720, 820 are electrically connected to a substrate 630, 730, 830 via bond wires 628, 728, 828 that protrude above the uppermost semiconductor dice thereof (or as in FIG. 7, below the lower most semiconductor dice), thus necessitating a higher package height 648, 748, 848.

Therefore, it would be advantageous to develop a stacking technique and assembly for increasing integrated circuit density while either decreasing the overall package height or providing additional protection for the packaged dice without increasing the package height and without the necessity of altering the fabrication of the stacked dice for flip-chip alignment and attachment.

BRIEF SUMMARY OF THE INVENTION

The present invention includes a stacked semiconductor assembly having a minimized package height, while providing protection for intermediate conductive elements that extend between the uppermost semiconductor die thereof and the substrate, and a method of making the same. The assembly includes a first semiconductor die having an active surface and a back side. The active surface includes a plurality of bond pads and a redistribution bond pad circuit thereon. The plurality of bond pads is electrically connected to integrated circuitry of the first semiconductor die, while the redistribution bond pads of the redistribution bond pad circuit are independent and, thus, electrically isolated from the integrated circuitry. Each redistribution bond pad circuit includes a first redistribution bond pad, a second redistribution bond pad positioned adjacent a periphery of the first semiconductor die, and a conductive trace extending between and electrically connecting the first redistribution bond pad and the second redistribution bond pad. The first semiconductor die may be disposed directly on a substrate or a plurality of additional dice may be vertically stacked on the substrate and beneath the first semiconductor die.

A second semiconductor die having an active surface and a back side is disposed above the first semiconductor die such that the active surfaces of both dice are facing one another. The active surface of the second semiconductor die includes a plurality of bond pads thereon. At least one electrical connector extends between at least one bond pad of the plurality of bond pads on the active surface of the second semiconductor die and at least one corresponding first redistribution bond pad of the plurality of redistribution bond pads on the first semiconductor die. The electrical connector also spaces the active surface of the second semiconductor die apart from the active surface of the first semiconductor die a sufficient distance so that bond wires or other discrete conductive elements protruding above the active surface of the first semiconductor die are electrically isolated from the active surface of the second semiconductor die and/or are not collapsed onto one another or bent, kinked or otherwise distorted by the second semiconductor die. Intermediate connective elements electrically connect the second semiconductor die and a substrate by extending from a bond pad on the first semiconductor die to a bond pad on the substrate.

Another embodiment of the invention includes a stacked semiconductor assembly and a method of making the same, wherein the top semiconductor die of the stack has peripheral edges that extend beyond the outer periphery of the immediately underlying semiconductor die. The back side of the lower semiconductor die is secured to a substrate or another semiconductor die or stack of semiconductor dice that are secured to a substrate.

The top semiconductor die is placed above the next lower semiconductor die in an active surface-to-active surface arrangement, with at least a portion of the active surface of the top semiconductor die being exposed beyond the outer periphery of the next lower semiconductor die. At least one electrical connector extends between at least one bond pad on the active surface of the top semiconductor die and at least one bond pad on the substrate to electrically connect the top semiconductor die to the substrate.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate exemplary embodiments for carrying out the invention.

DETAILED DESCRIPTION OF THE INVENTION

Figure 2:
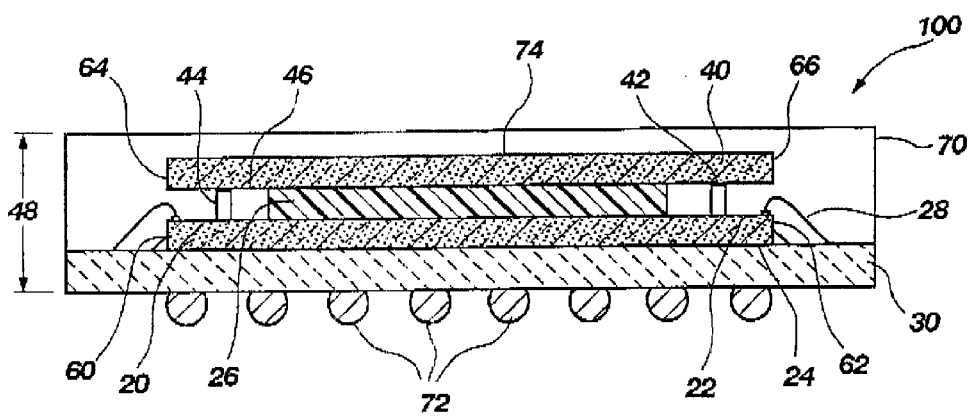
FIG. 2 is a cross-sectional view of an embodiment for a vertically stacked assembly according to the invention.

The present invention provides a stacked semiconductor package having a reduced package height or providing additional protection for the packaged elements without increasing the package height. As shown in FIG. 2, a stacked semiconductor assembly 100 according to the present invention includes a first semiconductor die 20 having an active surface 22 and a back side 24. In FIG. 2, the first semiconductor die 20 is shown attached to a substrate 30. Although the substrate 30 is depicted as comprising a circuit board, other types of substrates including, without limitation, interposers, other semiconductor devices and leads are also within the scope of the present invention. However, as discussed herein, additional semiconductor dice may be stacked between the first semiconductor die 20 and the substrate 30. A layer or film dielectric or insulative material 26 may be positioned between the active surface 22 of the first semiconductor die 20 and the active surface 46 of a second semiconductor die 40; such material may include an adhesive on one or both sides to facilitate assembly, or may comprise an electrically nonconductive adhesive to secure first semiconductor die 20 and second semiconductor die 40 to one another. In FIG. 2, the first semiconductor die 20 and second semiconductor die 40 are approximately the same size and the peripheral edges 60, 62 of the first semiconductor 20 and the peripheral edges 64, 66 of the second semiconductor die 40 are substantially aligned. Alternatively, the second semiconductor die 40 could be larger or smaller than the first semiconductor die 20.

Figure 3:
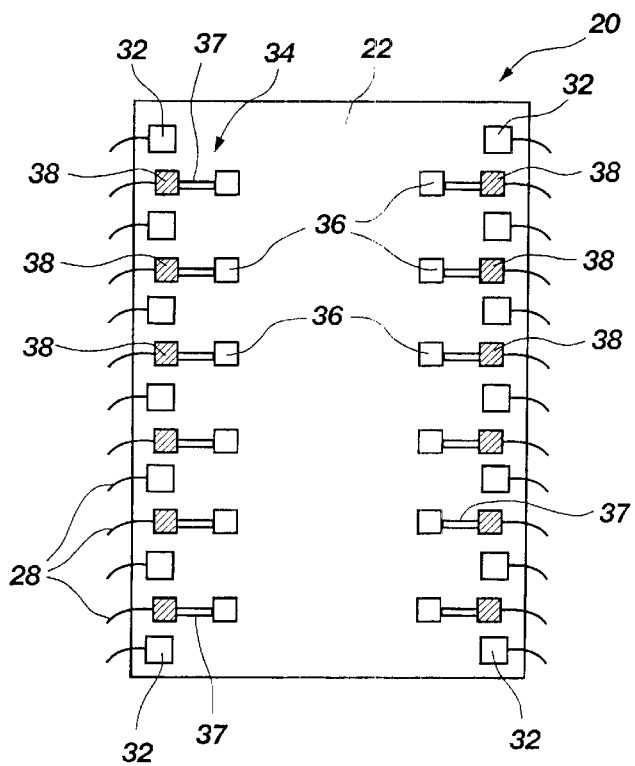
FIG. 3 is a top view of a semiconductor die including a redistribution circuit on an active surface thereof.

A plurality of discrete conductive elements 28, in the form of the illustrated bond wires 28, TAB elements, leads or the like, extend from bond pads 32 (FIG. 3) on the first semiconductor die 20 to contact areas (not shown) of the substrate 30. FIG. 3 depicts a top view of the active surface 22 of the first semiconductor die 20. Thus, components common to FIGS. 2 and 3 retain the same numeric designation. Referring to FIG. 3, the first semiconductor die 20 includes a plurality of bond pads 32 on the active surface 22 thereof, which are connected to integrated circuitry (not shown) of the first semiconductor die 20. In addition, the first semiconductor die 20 includes redistribution circuits 34, each of which includes a first redistribution bond pad 36 and a second redistribution bond pad 38 that is electrically connected to the first redistribution bond pad 36 by way of a conductive trace 37 extending therebetween. Each first redistribution bond pad 36 is located so as to align with a corresponding bond pad on the active surface 46 of the second semiconductor die 40 (not shown) upon positioning the second semiconductor die 40 in inverted orientation over the first semiconductor die 20. The second redistribution bond pad 38 may be located along the outer periphery of the first semiconductor die 20 to facilitate electrical connection of the second redistribution pads 38 to corresponding contact areas (not shown) of the substrate 30.

The redistribution circuit 34 is not connected to the integrated circuitry of the first semiconductor die 20. The redistribution circuit 34, including the first redistribution bond pad 36 and the second redistribution bond pad 38, may be fabricated using redistribution technology, for example, so called under bump metallurgy ("UBM") techniques. However, unlike current UBM techniques, the current invention redistributes substantially centrally located bond pads to the periphery of a semiconductor die. Further, unlike traditional UBM, the redistributed bond pads are not electrically connected to the semiconductor die.

Figure 4:
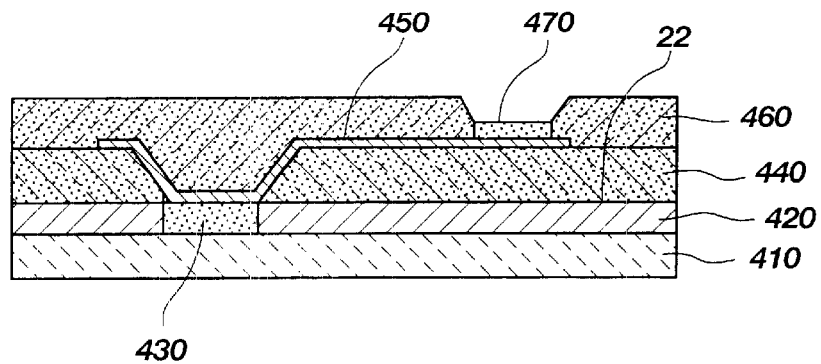
FIG. 4 is a partial cross-section view of a redistribution circuit on a semiconductor die.

Conductive traces 37 may be formed, by any method known in the art, to electrically connect first redistribution bond pads 36 with second redistribution bond pads 38. FIG. 4 depicts one exemplary method of creating the redistribution circuit 34 on a substrate 410. Pad redistribution using UBM may be performed by depositing an optional passivation layer 420, which may comprise nitride or silicon nitride, over a substrate 410 having first redistribution bond pads 430 thereon. The passivation layer 420 is either etched or selectively deposited to allow electrical connections to be made to the first redistribution bond pads 430. A dielectric layer 440, which may be formed from polyimide or benzocyclobutene ("BCB"), is deposited on the passivation layer 420. A thin film metal layer, such as titanium, copper, aluminum, NiV and/or nickel, is deposited (e.g., by sputtering on the dielectric layer 440 and then etched to form a metal trace 450. A second dielectric layer 460 is deposited and etched to reveal a second terminal via exposing a second, connected, redistribution bond pad 470. Thus, as shown in FIG. 3, each first redistribution bond pad 36 on a first part of the active surface 22 is electrically connected to a second redistribution bond pad 38 on a second part of the active surface 22. Referring to FIG. 4, electrical connections may be made to both second redistribution bond pads 470 or first redistribution bond pads 430.

Typically, under bump metallurgy is used to reroute peripheral bond pads on a semiconductor to a different location on the semiconductor surface. The industry continues to increase the number of devices on a substrate, thus necessitating an increase in bond pads for each device. At a point, the bond pads become too small to economically manufacture solder balls to be small enough to fit thereon.

Thus, in order to accommodate decreasing perimeter bond pad pitch, bond pads will be redistributed to other parts of the substrate. Accordingly, while FIG. 3 depicts the bond pads 32 of the first semiconductor die 20 located along the outer perimeter of the active surface 22, it is understood that the bond pads 32 may be redistributed to another part of the active surface 22. Additionally, it will be understood that the top semiconductor die of any embodiment of the invention may include a redistribution circuit thereon.

The active surface 46 of the second semiconductor die 40 has bond pads arranged in a mirror image of the complementary first redistribution bond pads 36 on the first semiconductor die 20. The second semiconductor die 40 can be electrically connected to the first redistribution bond pads 36 by an electrical connector 44 extending from at least one bond pad 42 on the active surface 46 of the second semiconductor die 40 to a first redistribution bond pad 36 on the active surface 22 of the first semiconductor die 20 (FIG. 2). The electrical connector 44 and the insulative material 26 space the active surface 46 of the second semiconductor die 40 from the active surface 22 of the first semiconductor die 20. The electrical connector 44 may be a pillar bump such as the type manufactured by Focus Interconnect. However, any electrical connection known in the art is sufficient. Pillar bumps typically include a copper base with eutectic solder caps for facilitating connection thereof to bond pads. By way of example, the height for the pillar bump may be between 95 μm and 200 μm. As seen in FIG. 3, discrete conductive elements 28, such as bond wires, may extend from the second redistribution bond pad 38, thus, electrically connecting bond pads 42 of the second semiconductor die 40, corresponding redistribution circuits 34 and corresponding contact areas (not shown) of the substrate 30.

Figure 1:
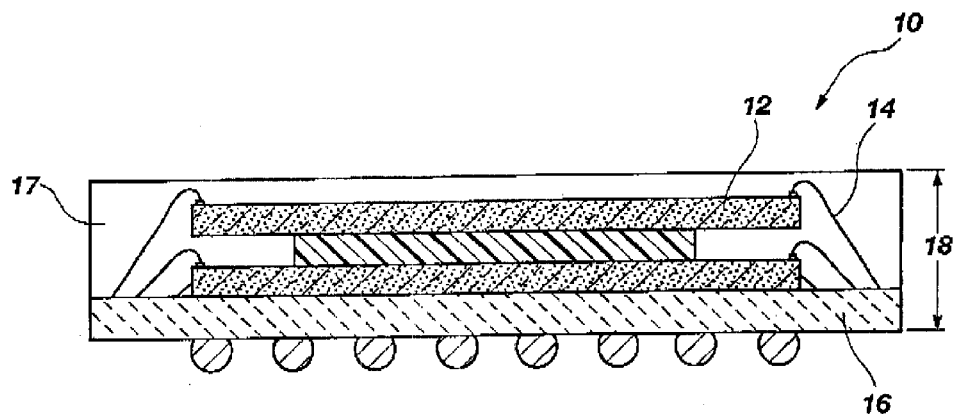
FIG. 1 is a side cross-sectional view of a prior art stacked semiconductor device that includes bond wires connecting bond pads of both top and bottom dice to a corresponding contact area of a substrate.

If desired, the stacked semiconductor assembly 100 may be encapsulated with an encapsulating material 70, such as silicone or epoxy, to form an encapsulated stacked semiconductor assembly 100. As seen by comparing FIG. 1 and FIG. 2, by eliminating the need for wire bonds to the top semiconductor die, the overall package height (18, 48) may be reduced. Alternatively, if the package height is maintained, the present invention provides increased protection between the bond wires 28 (and back side 74 of second semiconductor die 40) and the edges of the encapsulating material 70. Further, the elimination of long bond wires 14 between a top semiconductor die 12 and a substrate 16 results in less static and a decreased chance of wire sweep during packaging. A plurality of external solder balls 72 may be used for electrical connection of the stacked semiconductor assembly 100 to another assembly such as a printed circuit board (not shown).

Figure 5:
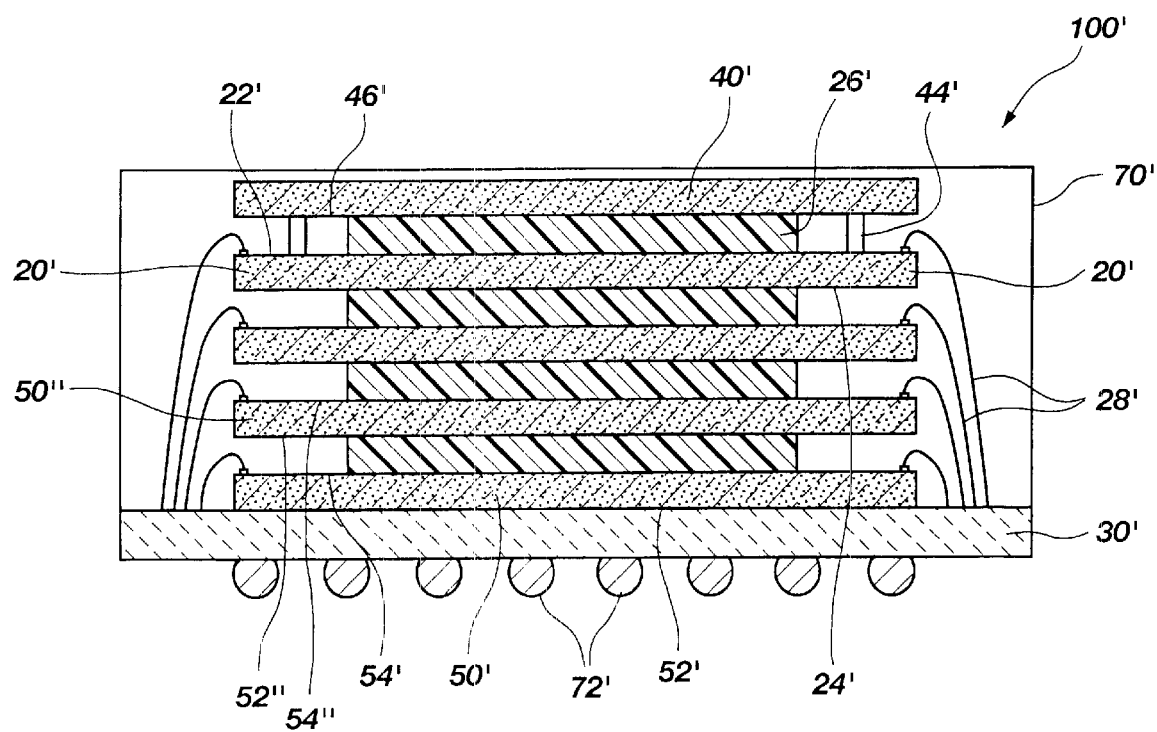
FIG. 5 is a cross-sectional view of an embodiment of a vertically stacked assembly including five semiconductor devices.
Figure 6:
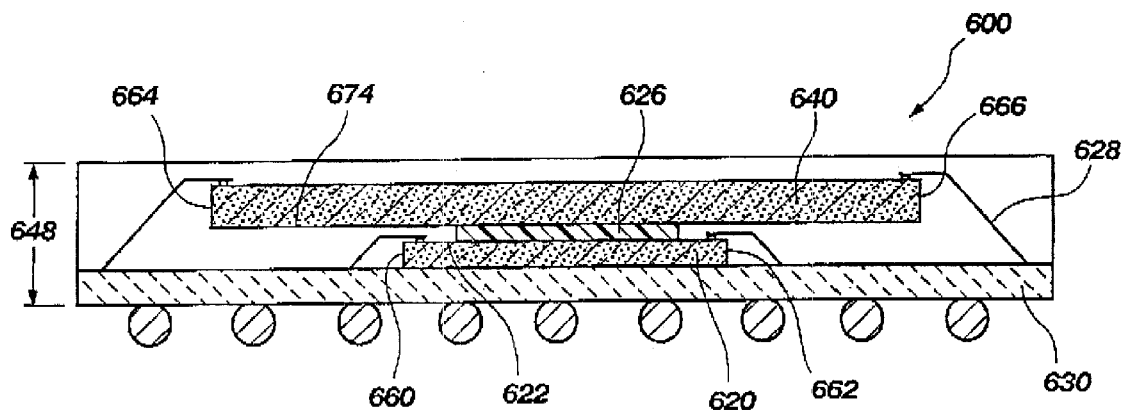
FIG. 6 is a cross-sectional view of a stacked semiconductor device that includes bond wires connecting top and bottom dice to a corresponding contact area of a substrate.

In another embodiment of a stacked semiconductor assembly 100', the first semiconductor die 20' is not disposed directly on the substrate 30' (FIG. 5). Instead, one or more additional dice are stacked vertically on the substrate 30'. The back side 52' of a bottom semiconductor die 50' is placed directly on the substrate 30'. Additional dice 50" are vertically stacked above the active surface 54' of bottom semiconductor die 50' in an active surface 54" to back side 52" arrangement. Insulative material 26' is placed between each vertically stacked die. Each semiconductor die is electrically attached to the substrate 30', by way of discrete conductive elements 28' such as bond wires, TAB elements, leads or the like. In FIG. 5, the first semiconductor die 20' is the last semiconductor die mounted in an active surface 54" to back side 24' configuration. The second semiconductor die 40' is inverted and mounted above the first semiconductor die 20' such that the active surface 46' of the second semiconductor die 40' is facing the active surface 22' of the first semiconductor die 20'. The active surface 22' of the first semiconductor die 20' includes a redistribution bond pad circuit (not shown), as described herein and depicted in FIG. 3. Thus, electrical connector 44' connects the second semiconductor die 40' to the redistribution circuit and discrete conductive elements 28' connect the redistribution circuit and the substrate 30'. If desired, the stacked semiconductor assembly 100' may be encapsulated with encapsulating material 70'. A plurality of external solder balls 72' may be used for electrical connection of the stacked semiconductor assembly 100' to another assembly such as a printed circuit board (not shown).

Figure 9:
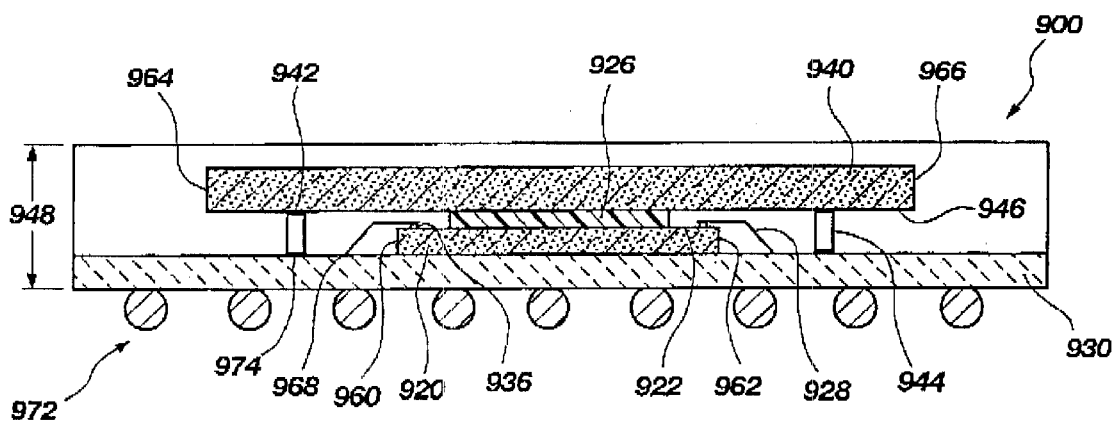
FIG. 9 is a cross-sectional view of an embodiment for a stacked assembly wherein the stacked dice are different sizes.
Figure 7:
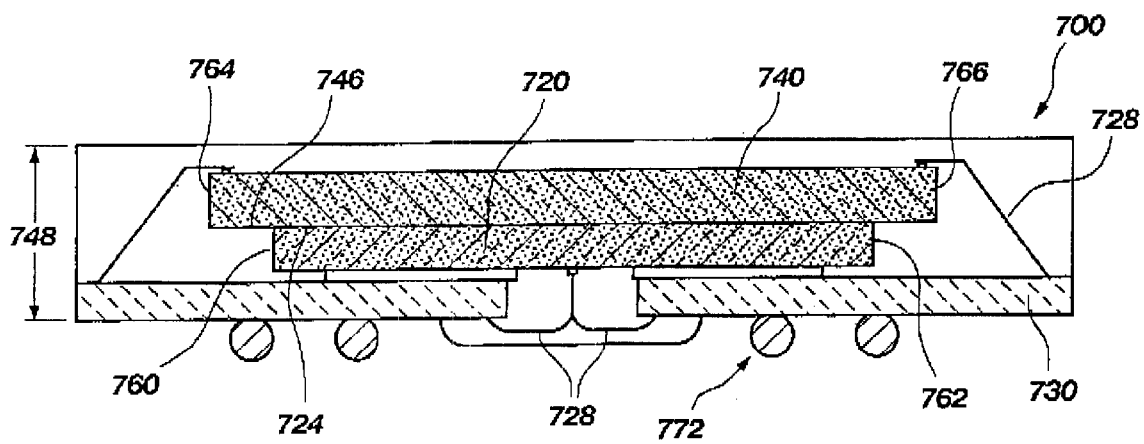
FIG. 7 is a cross-sectional view of a stacked semiconductor die assembly that includes bond wires electrically connecting bond pads of both top and bottom dice to a corresponding contact area of a substrate.
Figure 10:
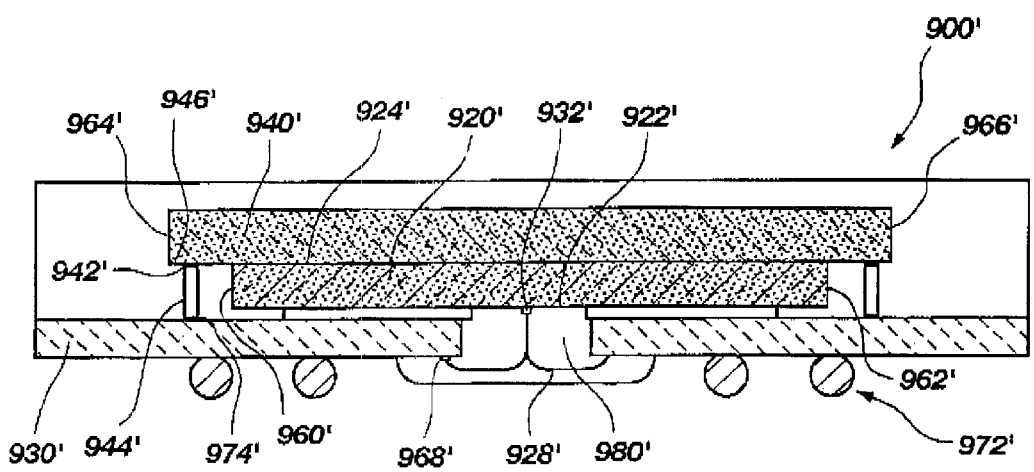
FIG. 10 is a cross-sectional view of an embodiment for a lead on chip and stacked semiconductor die combination.
Figure 8:
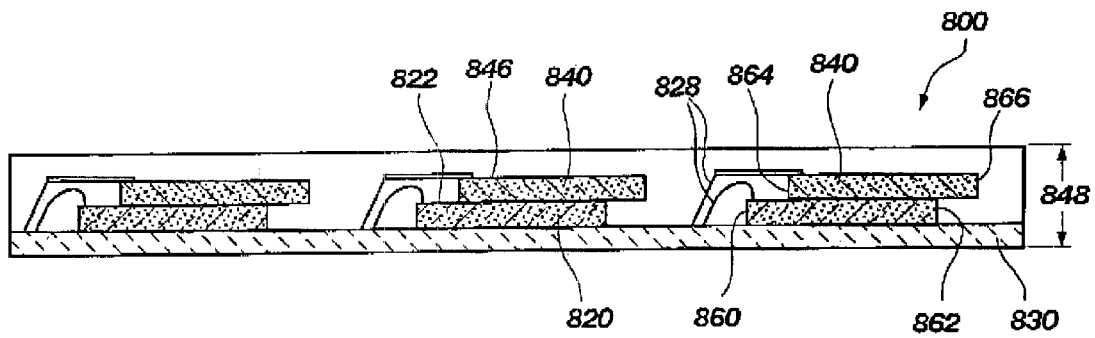
FIG. 8 is a cross-sectional view of a laterally staggered semiconductor die assembly.
Figure 11:
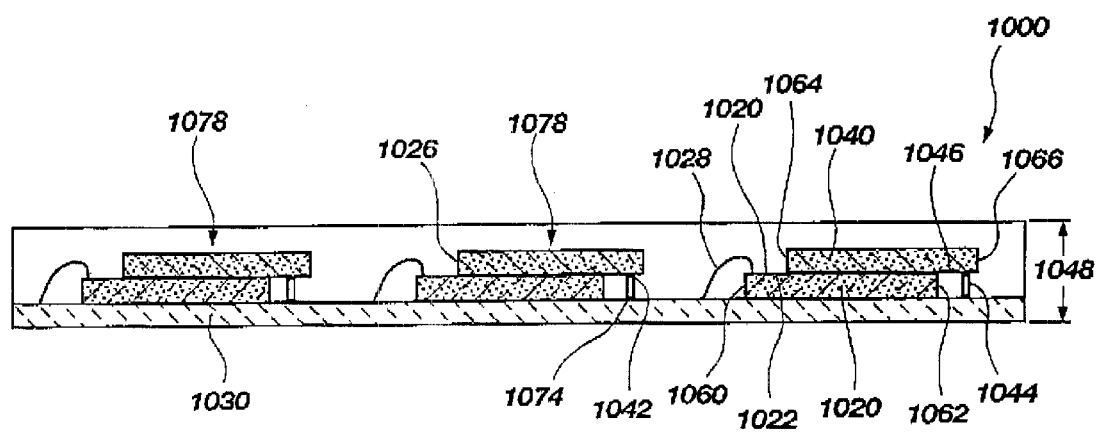
FIG. 11 is a cross-sectional view of an embodiment for a laterally staggered semiconductor die assembly.

Another embodiment of the invention provides a stacked semiconductor assembly wherein the edges of at least two of the semiconductor dice are not aligned (FIGS. 9, 10, 11). As depicted in FIG. 9, a stacked semiconductor package 900 according to the present invention is provided with a reduced package height 948 or with additional space between electrical connections and the encapsulating material without adding any height to the package. The stacked semiconductor package 900 includes a substrate 930 that includes conductive terminal pads and corresponding traces (not shown) and has at least two semiconductor dice 920, 940 disposed thereon. At least one of the peripheral edges 964, 966 of the top semiconductor die 940 extends laterally beyond at least one of the peripheral edges 960, 962 of a bottom semiconductor die 920. The top semiconductor die 940 has an active surface 946 facing the active surface 922 of the bottom semiconductor die 920. The bottom semiconductor die 920 may be disposed directly on the substrate 930, as shown, or may be stacked above at least one other die (not shown). Bond pads 936 of the bottom semiconductor die 920 may be electrically connected to the corresponding terminals 968 of the substrate 930, by way of discrete conductive elements 928. An electrical connector 944, such as a pillar column, bump, or ball of conductive material (e.g., solder, other metal, conductive or conductor-filled epoxy, anistropically conductive elastomer, etc.), extends from a bond pad 942 on the active surface 946 of the top semiconductor die 940 to the corresponding terminal pad 974 of the substrate 930. If desired, a layer or film of dielectric or insulative material 926 may be positioned between the active surface 946 of the top semiconductor die 940 and the active surface 922 of the bottom semiconductor die 920. If the stacked semiconductor package 900 is encapsulated, a plurality of external solder balls 972 may be used for electrical connection of the stacked semiconductor package 900 to another assembly such as a printed circuit board (not shown).

Figure 12:
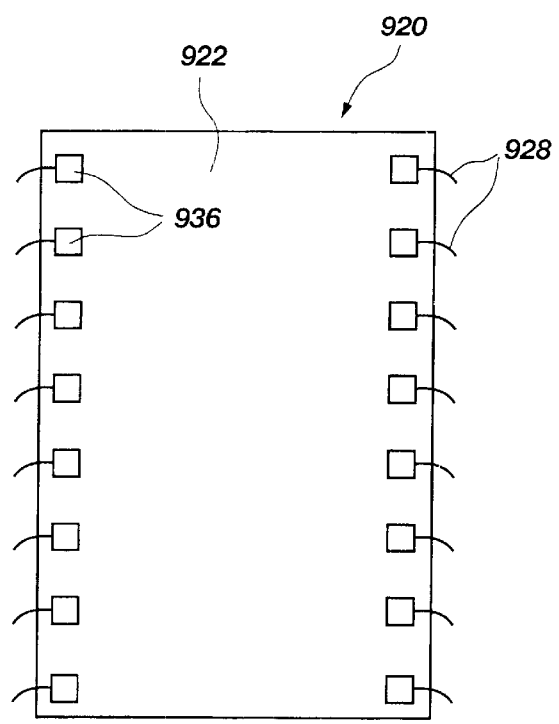
FIG. 12 is a top view of a semiconductor die according to an embodiment of the present invention.

In the stacked semiconductor package 900, of the embodiment shown in FIG.9, the active surface 922 of the bottom semiconductor die 920 may include a redistribution circuit as described herein and in FIG. 3. However, if the bond pads 942 of the top semiconductor die 940 can be connected to corresponding terminal pads 974 on the substrate 930 as shown in FIG. 9, a redistribution circuit is not required. Instead, as shown in FIG. 12, the active surface 922 of the bottom semiconductor die 920 may include bond pads 936 that are directly connected to corresponding terminal pads 974 on the substrate 930.

Figure 13:
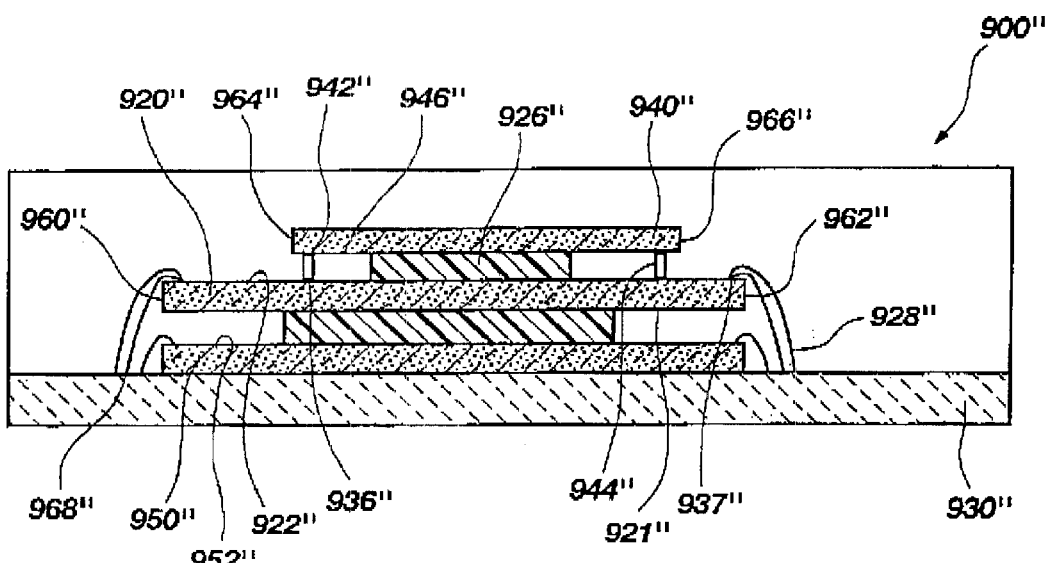
FIG. 13 is a cross-sectional view of an embodiment for a stacked assembly wherein the stacked dice are different sizes.

The stacked semiconductor package 900" of FIG. 13 is similar to the stacked semiconductor package 900 depicted in FIG. 9. FIG. 13 shows three stacked semiconductor die, however any number of die may be used. A first semiconductor die 950" may be disposed directly on a substrate 930", as shown, or may be stacked above at least one other die (not shown). A second semiconductor die 920" may be disposed above the first semiconductor die 950" such that the active surface 952" of first semiconductor die 950" faces the back side 921" of second semiconductor die 920". The first semiconductor die 950" and second semiconductor die 920" can be electrically connected to corresponding terminals 968" on the substrate 930", by way of discrete conductive elements 928".

Any desired number of semiconductor die may be stacked above the second semiconductor die. Alternatively, the last semiconductor die, a third semiconductor die 940", may be stacked directly above the second semiconductor die 920" such that the active surface 946" of the third semiconductor die 940" and the active surface 922" of the second semiconductor die 920" are facing. An insulative layer 926" may be disposed between the third semiconductor die 940" and the second semiconductor die 920" as well as between the second semiconductor die 920" and the first semiconductor die 950".

An electrical connector 944", such as a pillar column, bump, or ball of conductive material (e.g., solder, other metal, conductive or conductor-filled epoxy, anistropically conductive elastomer, etc.), extends from a bond pad 942" on the active surface 946" of the third semiconductor die 940" to a corresponding first redistribution bond pad 936" of the second semiconductor die 920". If the electrical connector 944" extends from the third semiconductor die 940" to the second semiconductor die 920", the second semiconductor die 920" may include redistribution circuits as described herein and with respect to FIG. 3. Discrete conductive elements 928" may extend from a second redistribution bond pad 937" to a corresponding terminal (not shown) on the substrate 930". If at least one peripheral edge 966", 964" of the third semiconductor die 940" extends beyond at least one peripheral edge 962", 960" of the second semiconductor die 920", the electrical connector 944" may extend from a bond pad 942" on the active surface 946" of the third semiconductor die 940" to a corresponding terminal pad on the substrate 930" (not shown) or a corresponding redistribution bond pad of a lower semiconductor die (not shown). In the latter situation, the lower semiconductor die may include redistribution circuits as described herein.

Figure 14:
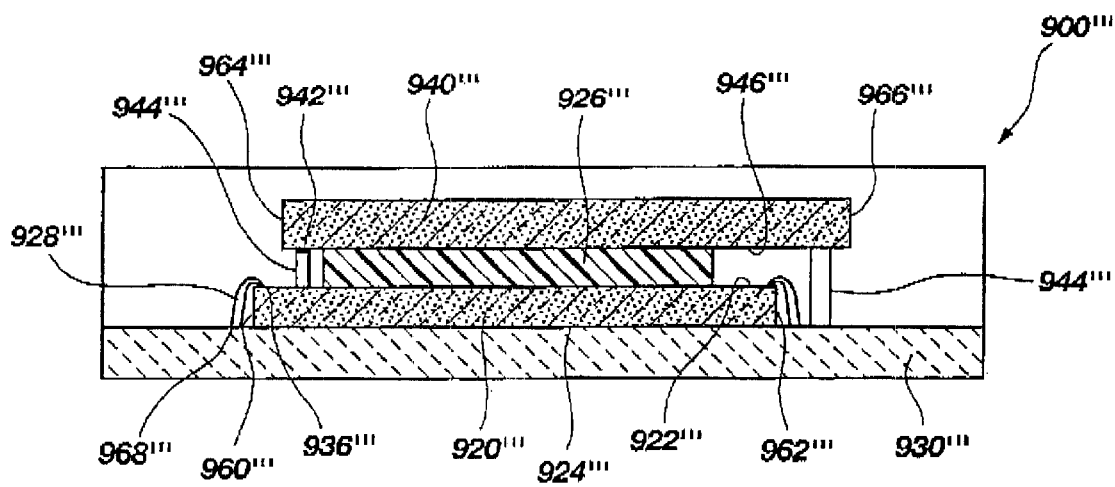
FIG. 14 is a cross-sectional view of an embodiment for a laterally stacked assembly of the present invention.

The stacked semiconductor package 900''' of FIG. 14 is similar to the stacked semiconductor package 900 depicted in FIG. 9. The back side 924''' of bottom semiconductor die 920''' maybe disposed on a substrate 930'''. Alternatively, a one or more semiconductor die may be disposed between the bottom semiconductor die 920''' and the substrate 930'''. The bottom semiconductor die 920''' may be electrically connected to the substrate 930''' by way of discrete conductive elements 928'''. An insulative layer 926''' may be disposed between bottom semiconductor die 920''' and top semiconductor die 940'''. At least one peripheral edge 966''' of the top semiconductor die 940''' extends beyond a corresponding peripheral edge 962''' of the bottom semiconductor die 920''', and at least one peripheral edge 960''' of the bottom semiconductor die 920''' extends beyond a corresponding peripheral edge 964''' of the top semiconductor die 940'''. A first electrical connector 944''', such as a pillar column, bump, or ball of conductive material (e.g., solder, other metal, conductive or conductor filled epoxy, anistropically conductive elastomer, etc.), extends from a bond pad 942''' on the active surface 946''' of the top semiconductor die 940''' to its corresponding bond pad 936''' on the bottom semiconductor die 920'''. The active surface 922''' of the bottom semiconductor die 920''' may include a redistribution circuit as depicted in FIG. 3 and described herein. A second electrical connector 944''' extends from a bond pad 942''' on the active surface 946''' of the top semiconductor die 940''' to its corresponding terminals 968''' of the substrate 930'''.

The stacked semiconductor package 900' of FIG. 10 is similar to the stacked semiconductor package 900 depicted in FIG. 9. The stacked semiconductor package 900' includes a substrate 930' that includes conductive terminal pads 968' and discrete conductive elements 928' and has at least two semiconductor dice 920', 940' disposed thereon. At least one of the peripheral edges 964', 966' of the top semiconductor die 940' extends laterally beyond at least one of the peripheral edges 960', 962' of a bottom semiconductor die 920'. In FIG. 10, the top semiconductor die 940' has an active surface 946' that faces the back side 924' of the bottom semiconductor die 920'. The bottom semiconductor die 920' may be disposed directly on a substrate 930', as shown, or may be stacked above at least one other semiconductor die. FIG. 10 depicts the bottom semiconductor die 920' as a LOC die with bond wires extending through an aperture in the substrate 930'. As shown, discrete conductive elements 928' may extend through an aperture 980' formed through the substrate 930' and connect bond pads 932' on the active surface 922' of the bottom semiconductor die 920' to corresponding terminals 968' on an opposite surface of the substrate 930'. Bond pads 932' of the bottom semiconductor die 920' may be electrically connected to corresponding terminal pads 968' of the substrate 930', by way of discrete conductive elements 928'. An electrical connector 944', such as a pillar column, bump, or ball of conductive material (e.g., solder, other metal, conductive or conductor-filled epoxy, anistropically conductive elastomer, etc.), extends from a bond pad 942' on the active surface 946' of the top semiconductor die 940' to the corresponding terminal pad 974' of the substrate 930'. If the stacked semiconductor package 900' is encapsulated, a plurality of external solder balls 972' may be used for electrical connection of the stacked semiconductor package 900' to another assembly such as a printed circuit board (not shown).

Referring to FIG. 11, stacked semiconductor package 1000 includes a substrate 1030 having a plurality of stacked multichip modules 1078 thereon. Each multichip module 1078 includes at least two semiconductor dice 1020, 1040. At least one of the peripheral edges 1064, 1066 of a top semiconductor die 1040 extends beyond at least one of the peripheral edges 1060, 1062 of a lower semiconductor die 1020. In FIG. 11, the top semiconductor die 1040 has an active surface 1046 that faces the active surface 1022 of the bottom semiconductor die 1020. As shown in FIG. 11, the active surface 1046 of the top semiconductor die 1040 may have unobstructed access to an underlying substrate 1030. If the area between the active surface 1046 of the top semiconductor die 1040 and an underlying substrate 1030 is obstructed by a die, or other object, that die or object can include a redistribution circuit as discussed herein.

The bottom semiconductor die 1020 may be disposed directly on a substrate 1030, as shown, or may be stacked above at least one other die (not shown). The bottom semiconductor die 1020 can be electrically connected to the substrate 1030 by way of discrete conductive elements 1028. An electrical connector 1044, such as a pillar column, bump, or ball of conductive material (e.g., solder, other metal, conductive or conductor-filled epoxy, anistropically conductive elastomer, etc.), extends from a bond pad 1042 on the active surface 1046 of the top semiconductor die 1040 to a corresponding terminal pad 1074 of the substrate 1030. An insulative layer 1026 may be disposed between the top semiconductor die 1040 and the bottom semiconductor die 1020. The multichip modules 1078 may be encapsulated either individually or as a group as shown in FIG. 11. By eliminating the need for wire bonds to the top semiconductor die 1040, the overall package height 1048 may be reduced. Alternatively, if the package height 1048 is maintained, the present invention provides increased protection between discrete conductive elements 1028 and the edges of the encapsulating material.

Figure 15:
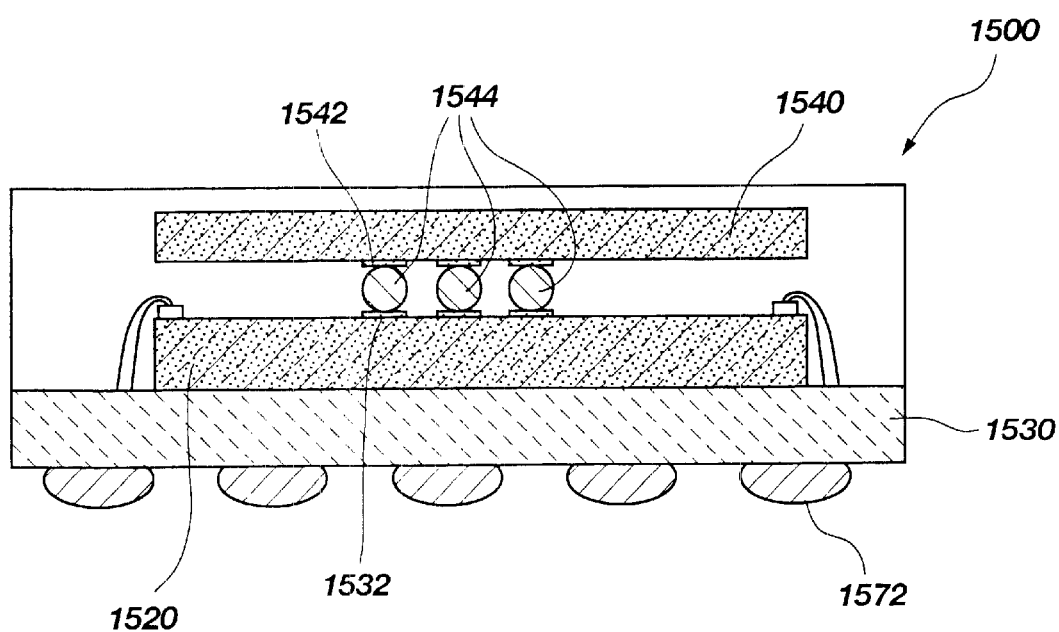
FIG. 15 is a cross-sectional view of an embodiment for a stacked assembly wherein the top semiconductor die is a leads over chip-type semiconductor device with centrally located bond pads.

Another embodiment of a stacked semiconductor package 1500 is shown in FIG. 15 wherein the top semiconductor die 1540 is an LOC-type semiconductor device with centrally located bond pads 1542. At least one electrical connector 1544 extends from bond pads 1542 on the top semiconductor die 1540 to corresponding bond pads 1532 on the bottom semiconductor die 1520, as shown, or to corresponding terminal pads on the substrate 1530 (not shown). The bottom semiconductor die 1520 may include redistribution circuits as shown in FIG. 3 and described herein. The stacked semiconductor package 1500 may be encapsulated and a plurality of external solder balls 1572 may be used for electrical connection of the stacked semiconductor package 1500 to another assembly such as a printed circuit board (not shown).

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method of forming a stacked semiconductor assembly, comprising:

providing a first semiconductor die including an active surface and a back side, the active surface including, a plurality of bond pads, a plurality of redistribution pads and a plurality of metal traces thereon, the plurality of redistribution pads electrically independent from integrated circuitry in the first semiconductor die, at least one metal trace of the plurality of metal traces connecting at least a first redistribution pad of the plurality of redistribution pads and at least a second redistribution pad of the plurality of redistribution pads;

providing a second semiconductor die including an active surface and a back side, the active surface of the first semiconductor die facing the active surface of the second semiconductor die, the active surface of the second semiconductor die including a plurality of bond pads thereon;

electrically connecting the first redistribution pad of the first semiconductor die and a corresponding bond pad of the plurality of bond pads of the second semiconductor die; and electrically connecting the second redistribution pad of the first semiconductor die and a corresponding contact area of a substrate.

2. The method according to claim 1, further comprising disposing the back side of the first semiconductor die on the substrate and electrically connecting at least one bond pad of the plurality of bond pads of the first semiconductor die to a corresponding contact area of the substrate.

3. The method according to claim 1, wherein the electrically connecting the second redistribution pad and the corresponding contact area comprises extending a discrete conductive element between the second redistribution pad and the substrate.

4. The method according to claim 1, further comprising:

providing at least one additional semiconductor die on the substrate; and disposing the back side of the first semiconductor die on the at least one additional semiconductor die.

5. The method according to claim 1, further comprising providing an insulative layer between the first semiconductor die and the semiconductor second die.

6. The method according to claim 1, wherein the electrically connecting the first redistribution pad and the corresponding bond pad comprises extending a conductive element between the corresponding bond pad of the second semiconductor die and the first redistribution pad of the first semiconductor die.

7. The method according to claim 1, wherein the providing the second semiconductor die comprises substantially vertically aligning at least one edge of the second semiconductor die and at least one edge of the first semiconductor die.

8. The method according to claim 1, further comprising encapsulating the stacked semiconductor assembly.

9. A method of forming a stacked semiconductor package, comprising:

providing a substrate including a plurality of contact areas;

providing a first semiconductor die including an active surface, a back side, and a plurality of peripheral edges, the back side disposed above the substrate, the active surface including a plurality of bond pads thereon; at least one redistribution bond pad circuit on the active surface of the first semiconductor die, the at least one redistribution bond pad electrically independent from integrated circuitry of the first semiconductor die and including a plurality of redistribution bond pads;

disposing a top semiconductor die above the first semiconductor die, the top semiconductor die including an active surface, a back side and a plurality of peripheral edges, the active surface of the top semiconductor die facing the active surface of the first semiconductor die and including a plurality of bond pads thereon, at least one edge of the plurality of peripheral edges of the top semiconductor die extending laterally beyond at least one corresponding peripheral edge of the plurality of peripheral edges of the first semiconductor die; and extending at least one conductive element between at least one bond pad of the plurality of bond pads on the top semiconductor die and a corresponding contact area of the plurality of contact areas of the substrate adjacent to the at least one corresponding peripheral edge of the first semiconductor die.

10. The method according to claim 9, further comprising:

stacking at least one additional semiconductor die vertically on the substrate, wherein the back side of the first semiconductor die is disposed on the at least one additional semiconductor die.

11. The method according to claim 9, further comprising electrically connecting at least one bond pad of the plurality of bond pads of the first semiconductor die and a corresponding contact area of the substrate.

12. The method according to claim 9, further comprising electrically connecting a first redistribution bond pad of the plurality of redistribution bond pads and a second redistribution bond pad of the plurality of redistribution bond pads, the second redistribution bond pad proximate the perimeter of the first semiconductor die.

13. The method according to claim 9, wherein the providing the first semiconductor die comprises providing a first semiconductor die including at least one redistribution bond pad circuit on the active surface thereof, the at least one redistribution bond pad circuit independent from integrated circuitry of the first semiconductor die and including a plurality of redistribution bond pads.

14. The method according to claim 13, wherein the providing the first semiconductor die further comprises electrically connecting a first redistribution bond pad of the plurality of redistribution bond pads and a second redistribution bond pad of the plurality of redistribution bond pads, the second redistribution bond pad proximate a perimeter of the first semiconductor die.

15. The method according to claim 14, further comprising extending at least one connective element between at least one bond pad of the plurality of bond pads on the active surface of the first semiconductor die and the first redistribution bond pad on the active surface of the first semiconductor die.

16. The method according to claim 15, further comprising electrically connecting the second redistribution bond pad and a corresponding contact area of the substrate.

17. The method according to claim 16, wherein the electrically connecting comprises extending at least one discrete conductive element between the second redistribution bond pad and the corresponding contact area of the substrate.

18. The method according to claim 17, wherein the at least one discrete conductive element comprises at least one of wire bonds, TAB elements, and leads.

19. The method according to claim 9, wherein the extending at least one conductive element comprises extending a substantially columnar pillar between the at least one bond pad of the plurality of bond pads on the top semiconductor die and the corresponding contact area of the substrate adjacent the at least one corresponding peripheral edge of the first semiconductor die.

20. The method according to claim 9, wherein the extending at least one conductive element comprises extending a solder ball between the at least one bond pad of the plurality of bond pads on the top semiconductor die and the corresponding contact area of the substrate adjacent to the at least one corresponding peripheral edge of the first semiconductor die.

21. The method according to claim 9, wherein the extending the at least one conductive element comprises extending at least one conductive element from the at least one bond pad of the top semiconductor die to the corresponding contact area of the substrate.

22. The method according to claim 9, further comprising providing an insulative layer between the first semiconductor die and the top semiconductor die.

23. The method according to claim 22, wherein the providing the insulative layer comprises providing a layer of adhesive material.

24. The method according to claim 9, further comprising encapsulating the stacked semiconductor package.

25. A method of designing a semiconductor device to be used as a lower semiconductor device in a stacked semiconductor assembly, the method comprising:
providing a first semiconductor device including an active surface and a back side, the active surface including and a plurality of bond pads thereon; and
designing at least one redistribution circuit on the active surface, the at least one redistribution circuit independent from integrated circuitry in the first semiconductor device.

26. The method according to claim 25, wherein the designing the at least one redistribution circuit comprises providing at least one first redistribution bond pad and at least one second redistribution bond pad.

27. The method according to claim 26, wherein the designing the at least one redistribution circuit ether comprises electrically connecting the at least one first redistribution bond pad and the at least one second redistribution bond pad.

28. The method according to claim 27, wherein the electrically connecting comprises extending a metal trace between the at least one first redistribution bond pad and the at least one second redistribution bond pad.

29. The method according to claim 26, wherein the providing the at least one first redistribution bond pad comprises providing at least one first redistribution bond pad positioned on the active surface in a location that mirrors a location, of a corresponding bond pad of a second semiconductor device to be positioned over the first semiconductor device.

30. The method according to claim 26, wherein the designing the at least one redistribution circuit comprises:
forming a first dielectric layer on the active surface;
etching the first dielectric layer;
depositing a metal layer over the first dielectric layer;
etching the metal layer;
forming a second dielectric layer over the metal layer; and
etching the second dielectric layer.

31. The method according to claim 30, wherein the etching the first dielectric layer exposes the at least one first redistribution bond pad.

32. The method according to claim 30, wherein the etching the metal layer creates a metal trace.

33. The method according to claim 30, wherein the etching the second dielectric layer exposes the at least one second redistribution bond pad.

34. The method according to claim 30, further comprising depositing a passivation layer on the active surface.

35. The method according to claim 34, wherein the passivation layer comprises nitride or silicon nitride.

36. The method according to claim 30, wherein the first dielectric layer comprises polyimide or BCB.

37. The method according to claim 30, wherein the metal layer is selected from the group consisting of titanium, copper, aluminum, NiV and nickel.

38. The method according to claim 30, wherein the depositing the metal layer comprises sputtering.

39. A method for redistributing bond pads of a semiconductor device, the method comprising:
providing a semiconductor device including an active surface having a first set of substantially centrally located bond pads and a second set of substantially peripherally located bond pads thereon, the second set of substantially peripherally located bond pads and the first set of substantially centrally located bond pads are electrically independent from the semiconductor device integrated circuitry; and
electrically connecting at least one bond pad of the first set of substantially centrally located bond pads to a corresponding second bond pad of the second set of substantially peripherally located bond pads.

40. The method according to claim 39, wherein the electrically connecting comprises extending a metal trace between the at least one bond pad and the corresponding second bond pad.

41. The method according to claim 39, wherein the electrically connecting the at least one bond pad comprises:
   forming a first dielectric layer on the active surface;
   depositing a metal layer over the first dielectric layer; and forming a second dielectric layer over the metal layer.

42. The method according to claim 41, further comprising etching the first dielectric layer to expose the at least one bond pad of the first set of substantially centrally located bond pads.

43. The method according to claim 41, further comprising etching the metal layer to create a metal trace between the at least one bond pad and the corresponding second bond pad.

44. The method according to claim 41, further comprising etching the second dielectric layer to expose the corresponding second bond pad.

45. The method according to claim 41, further comprising depositing a passivation layer on the active surface.

46. The method according to claim 45, wherein the passivation layer comprises nitride or silicon nitride.

47. The method according to claim 41, wherein the first dielectric layer comprises polyimide or BCB.

48. The method according to claim 41, wherein the metal layer is selected from the group consisting of titanium, copper, aluminum, NiV and nickel.

49. The method according to claim 41, wherein the depositing the metal layer comprises sputtering.

* * * * *

UNITED STATES PATENT AND TRADEMARK OFFICE
CERTIFICATE OF CORRECTION

PATENT NO. : 6,706,557 B2
DATED : March 16, 2004
INVENTOR(S) : Michel Koopmans

It is certified that error appears in the above-identified patent and that said Letters Patent is hereby corrected as shown below:

Column 2,
Line 25, change "Famworth" to -- Farnworth --

Column 7,
Line 10, change "semiconductordie" to -- semiconductor die --

Column 9,
Line 46, change "maybe" to -- may be --

Column 12,
Line 13, change "semiconductor second" to -- second semiconductor --

Column 13,
Line 67, remove (the first) "and"

Column 14,
Line 10, change "ether" to -- further --
Line 22, remove comma after "location"

Signed and Sealed this

Twenty-second Day of March, 2005

JON W. DUDAS
*Director of the United States Patent and Trademark Office*